(12) United States Patent
Kim et al.

(10) Patent No.: US 6,333,666 B2
(45) Date of Patent: Dec. 25, 2001

(54) ANTIFUSE CIRCUIT BEING PROGRAMMABLE BY USING NO CONNECTION PIN

(75) Inventors: Phil-Jung Kim; Jae-Kyung Wee; Chang-Hyuk Lee; Jin-Keun Oh; Jae-Seok Park; Oh-Won Kwon; Ho-Youb Cho, all of Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/737,854

(22) Filed: Dec. 18, 2000

(30) Foreign Application Priority Data

Dec. 29, 1999 (KR) .................................. 99-65012

(51) Int. Cl.[7] .................................................. H01H 37/76
(52) U.S. Cl. ........................................ 327/525; 327/526
(58) Field of Search .................................. 327/525, 526, 327/143

(56) References Cited

U.S. PATENT DOCUMENTS

| | | | | |
|---|---|---|---|---|
| 4,730,129 | * | 3/1988 | Kunitoki et al. ..................... | 327/525 |
| 5,600,277 | * | 2/1997 | Koelling ................................ | 327/525 |
| 5,619,469 | * | 4/1997 | Joo ...................................... | 365/225.7 |
| 5,789,970 | * | 8/1998 | Denham ............................... | 327/525 |
| 6,087,890 | * | 7/2000 | Kim ..................................... | 327/526 |
| 6,157,583 | * | 12/2000 | Starnes et al. ....................... | 365/200 |
| 6,281,739 | * | 8/2000 | Matsui ................................. | 327/525 |

* cited by examiner

Primary Examiner—Terry D. Cunningham
(74) Attorney, Agent, or Firm—Finnegan, Henderson, Farabow, Garrett & Dunner, L.L.P.

(57) ABSTRACT

An antifuse circuit provides a stabilized high voltage to an antifuse programming circuit through the use of an NC pin which is not used in the chip operation. For the purpose, the antifuse circuit includes a power-up detecting circuit for generating a power stabilization signal by detecting a supply voltage; a power-up pulse circuit for generating a first and a second control signal in response to the power stabilization signal; an antifuse programming circuit for, under the control of the first and the second control signals, detecting whether an antifuse element is programmed or not, latching the result of the detection and programming the antifuse element in response to an external high voltage and a precharge signal; a pin for receiving the external high voltage so as to program the antifuse element; a pad for providing the external high voltage to the inside of the chip; and a diode for supplying the external high voltage to the antifuse programming circuit and preventing a voltage of the antifuse programming circuit from being provided to the pin.

6 Claims, 3 Drawing Sheets

——— PROGRAMMED ANTIFUSE

--------- UNPROGRAMMED ANTIFUSE

ANTIFUSE CIRCUIT BEING PROGRAMMABLE BY USING NO CONNECTION PIN

FIELD OF THE INVENTION

The present invention relates to an antifuse circuit; particularly to an antifuse circuit for providing an external high voltage to an antifuse programming circuit through the use of a no connection (NC) pin which is not used in the chip operation, and reducing the number of transistors which constitute a detection and latch unit to thereby improve the stabilization of high voltage signals and the integration of memory devices.

DESCRIPTION OF THE PRIOR ART

Referring to FIG. 1, there is described a block diagram of a conventional antifuse circuit.

In FIG. 1, an oscillator 10 generates a first clock signal CLK and a second clock signal CLKB based on a programming signal PGM coupled thereto. Then, the first and the second clock signals CLK and CLKB are fed to a high voltage generator 20.

The high voltage generator 20 produces a high voltage HV by using the first and the second clock signals CLK and CLKB inputted thereto and provides the high voltage HV to an antifuse programming circuit 30 which programs an antifuse element through the use of the high voltage HV.

A power-up detecting circuit 40 generates a power stabilization signal PWRUP by sensing a supply voltage Vcc.

A power-up pulse circuit 50 generates a first to a third control signal PWR, PWRB and PWR_P by using the power stabilization signal PWRUP fed thereto and supplies the control signals to the antifuse programming circuit 30, wherein the control signals are used to detect whether the antifuse element is programmed or not, and to latch the result of the detection.

The antifuse programming circuit 30 programs the antifuse element, or detects whether the antifuse element is programmed or not and latches the result of the detection by using the first to third control signals PWR, PWRB and PWR_P, the high voltage HV and a precharge signal PC coupled thereto, to thereby produce an output Rout.

Referring to FIG. 2, there is illustrated a schematic diagram of the conventional antifuse programming circuit 30.

When programming an antifuse element F1, a voltage higher than 8V is supplied to the high voltage node HV, and the precharge signal PC and a select node SA become a logic high state. Thereafter, the antifuse element F1 is programmed by the voltage difference between its both ends.

In case the antifuse element F1 is unprogrammed, a leak voltage close to 0V is fed to a first node A1. Then, a third PMOS transistor P3 is turned on by the second control signal PWRB and a fourth PMOS transistor P4 is turned on by the leak voltage provided through the first node A1. As a result, a supply voltage is coupled to a second node A2. The supply voltage fed to the second node A2 turns on a fifth NMOS transistor N5 that in turn connects an input node A3 of a latch unit 303 to ground. The latch unit 303 outputs an unprogrammed signal having a logic high state by the ground voltage coupled to its input node A3.

On the other hand, in case the antifuse element F1 is programmed, a voltage Vcc-Vt is inputted to the first node A1 so that the fourth PMOS transistor P4 is turned off and the fourth NMOS transistor N4 is turned on by the third control signal PWR_P. Thereafter, the second node A2 becomes to have a logic low state. Then, the fifth PMOS transistor P5 is turned on by the second control signal PWRB and the sixth PMOS transistor P6 is turned on by the logic low level of the second node A2. As a result, the supply voltage is provided to the third node A3 and the latch unit 303 outputs a programmed signal having a logic low state by the supply voltage on the third node A3.

As can be seen above, the high voltage used in programming the antifuse element is provided from the antifuse programming circuit by using the oscillator and the high voltage generator embodied in a chip. However, an unstable voltage has been provided to the antifuse programming circuit by the variance of the high voltage due to the fabrication variance and the temperature when fabricating the oscillator and the high voltage generator. As a result, the failure rate increases and the integration decreases since the oscillator and the high voltage generator occupy a large area.

SUMMARY OF THE INVENTION

It is, therefore, an object of the present invention to provide a circuit for providing an antifuse programming circuit with an external high voltage delivered by using a no connection (NC) pin that is not used in the chip operation.

In accordance with an embodiment of the present invention, there is provided a antifuse circuit comprising: a power-up detecting circuit for generating a power stabilization signal by detecting a supply voltage; a power-up pulse circuit for generating a first and a second control signal in response to the power stabilization signal; an antifuse programming circuit for, under the control of the first and the second control signals, detecting whether an antifuse element is programmed or not, latching the result of the detection and programming the antifuse element in response to an external high voltage and a precharge signal; a pin for receiving the external high voltage so as to program the antifuse element; a pad for providing the external high voltage to the inside of the chip; and a diode for supplying the external high voltage to the antifuse programming circuit and preventing a voltage of the antifuse programming circuit from being provided to the pin.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
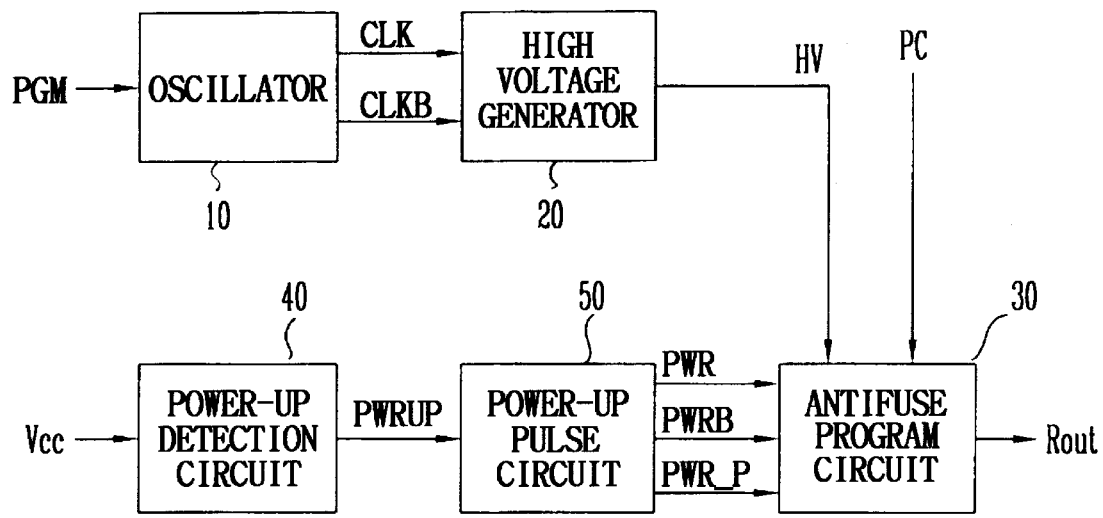
FIG. 1 shows a block diagram of a conventional antifuse circuit.
Figure 2:
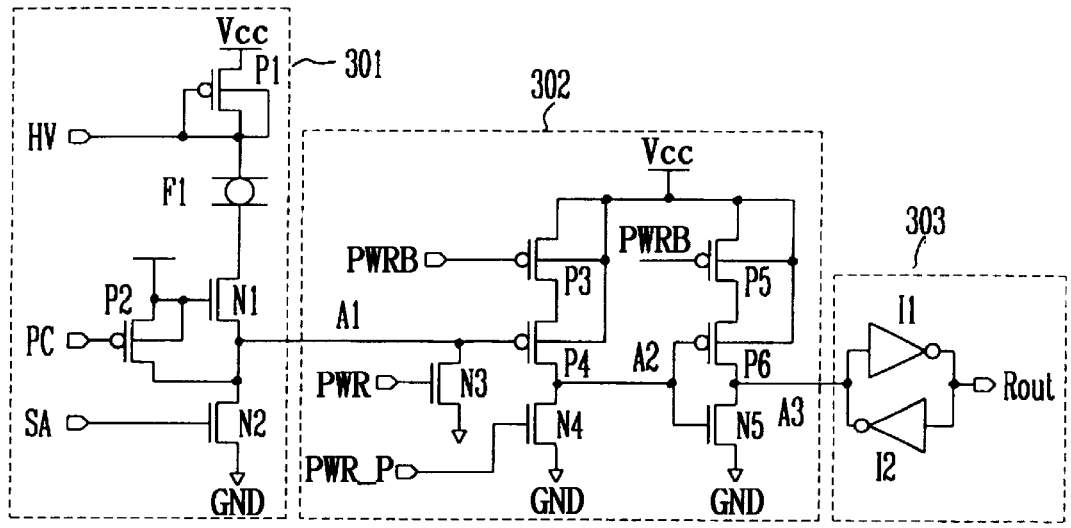
FIG. 2 illustrates a schematic diagram of the antifuse programming circuit in FIG. 1.
Figure 3:
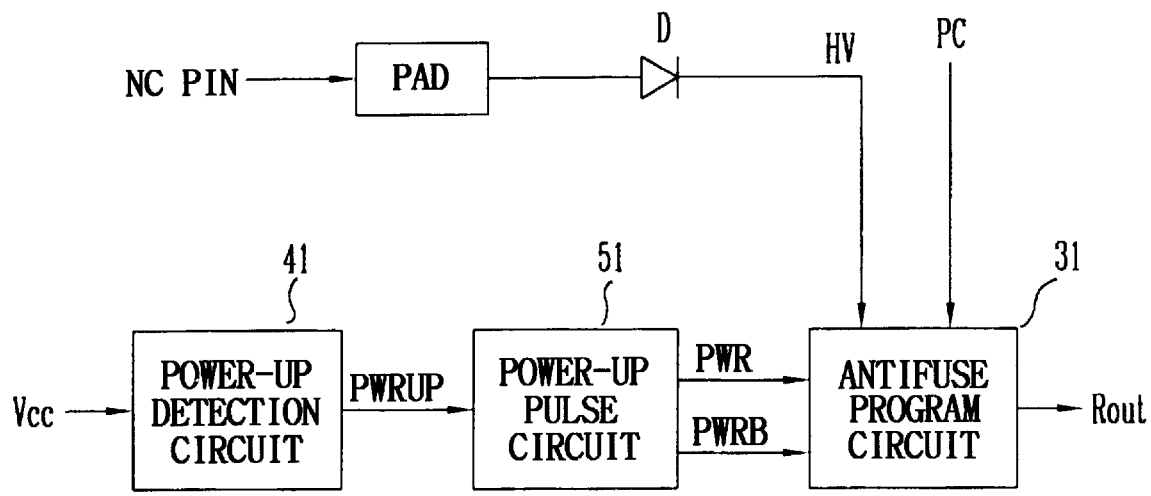
FIG. 3 is a block diagram of an antifuse circuit employing an NC pin in accordance with the present invention.

Referring to FIG. 3, there is illustrated a block diagram of an antifuse circuit employing an NC pin in accordance with the present invention.

An external high voltage is inputted to the NC pin that is connected to a pad 21 within a memory device. The high voltage fed to the memory device through the pad 21 is coupled to a high voltage node HV via a diode D so as to program an antifuse element F2. The diode D is employed to deliver the external high voltage inputted through the NC pin to the inside of the memory chip device and also to prevent an internal voltage of the memory chip from being transmitted to the NC pin.

By using first and second control signals PWR and PWRB, the high voltage HV and a precharge signal PC coupled thereto, an antifuse programming circuit 31 programs the antifuse element F2, or detects whether the antifuse element F2 is programmed or not and latches the result of the detection to thereby generate an output Rout.

Figure 4:
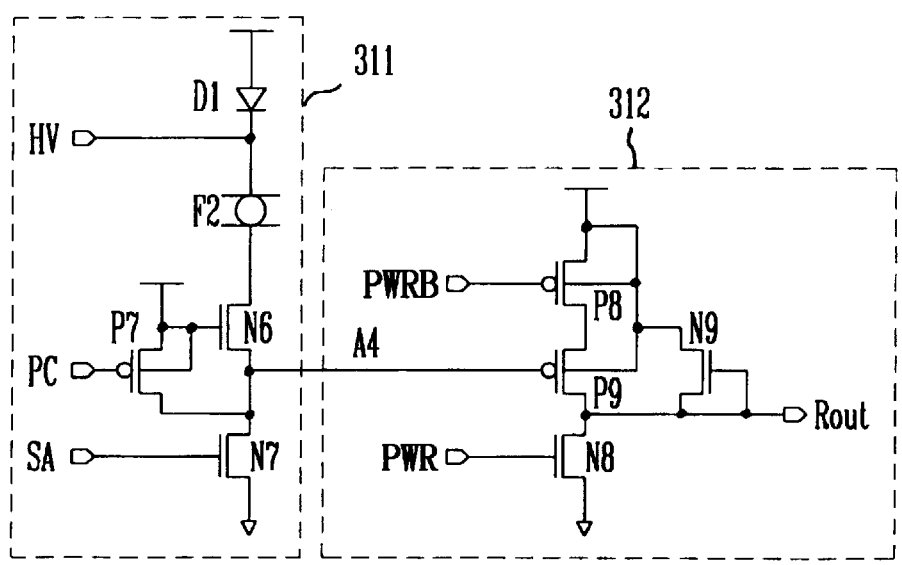
FIG. 4 provides a schematic diagram of the antifuse programming circuit in accordance with an embodiment of the present invention.

Referring to FIG. 4, there is described a schematic diagram of the antifuse programming circuit 31.

A programming block 311 programming the antifuse element F2 directly receives the external high voltage instead of being provided with a high voltage from an oscillator and a high voltage generator. Since the precharge signal PC and a select node SA have a logic high state, a seventh PMOS transistor P7 is turned off and a seventh NMOS transistor N7 is turned on. Then, since a sixth NMOS transistor N6 is turned on by a supply voltage and the seventh NMOS transistor N7 is turned on as illustrated above, one end of the antifuse element F2 is connected to ground. As a result, the antifuse element F2 is programmed by the voltage difference of its both ends, wherein one end of the antifuse element F2 is connected to ground and the other end thereof is attached to the high voltage node HV.

Hereinafter, the operation detecting whether the antifuse element F2 is programmed or not will be explained.

In case the antifuse element F2 is unprogrammed, since the precharge signal PC has a logic high state and the select node SA is in a logic low state, a fourth node A4 has a leak voltage close to 0V. Therefore, an eighth PMOS transistor P8 is turned on by the second control signal PWRB and a ninth PMOS transistor P9 is turned on by the voltage level of the fourth node A4. Although an eighth NMOS transistor N8 is turned on by the first control signal PWR, an output Rout has a logic high state because the on-resistance of the NMOS transistor N8 is designed to have a large value. A ninth NMOS transistor N9 is turned on when the output Rout has a logic high state, thereby compensating an amount of electric charge which is leaked to ground through the eighth NMOS transistor N8 so as to stabilize the voltage level of the output Rout.

On the other hand, in case of the antifuse element F2 programmed, a voltage Vcc-Vt voltage-dropped by the diode D1 is provided to the fourth node A4. Thereafter, the ninth PMOS transistor P9 is turned off by the voltage level of the fourth node A4 and the eighth NMOS transistor N8 is turned on by the first control signal PWR. The output Rout, which is in a logic high state and latches the program status of the antifuse element F2, moves to a logic low state by connected to ground through the eighth NMOS transistor N8 and, at this time, the ninth NMOS transistor N9 is turned off because its gate is connected to ground.

Figure 5A:
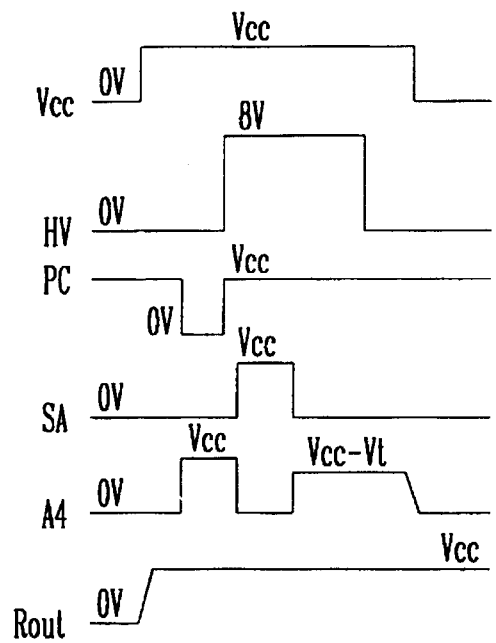
FIGS. 5A and 5B represent waveform diagrams of inputs and outputs in case of programming the antifuse element and detecting whether the antifuse element is programmed or not.

FIG. 5A represents a waveform diagram of inputs and outputs and voltage levels of nodes of the antifuse programming circuit 31 when programming the antifuse element F2.

The described 8V voltage of the high voltage input node HV is an external high voltage provided through the NC pin from the outside of the memory chip.

The low pulse of the precharge signal PC is used to provide the Vcc voltage to one end of the antifuse element F2 so as to reduce the voltage difference between both ends of the antifuse element F2, thereby preventing the antifuse element F2 from being programmed during its unprogramming operation.

The high pulse of the select node SA indicates a signal selecting an antifuse element to be programmed.

The Vcc voltage of the first node A1 is a voltage at the moment when a voltage, preventing the antifuse element from being programmed, is provided to the first node A1 and the Vcc-Vt voltage shows a voltage at the moment when the supply voltage dropped as much as a threshold voltage Vt by the diode D1 after the antifuse element is programmed is inputted to the first node A1, wherein Vt is a threshold voltage of the diode D1. At this time, since, although the antifuse element F2 was programmed, the operation of detecting whether the antifuse element F2 is programmed or not is not performed, the output Rout still maintains its logic high state.

Figure 5B:
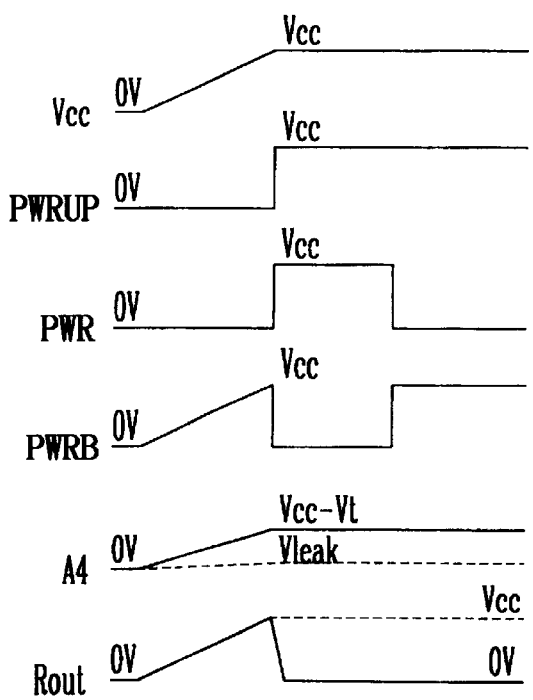

Referring to FIG. 5B, there is illustrated a waveform diagram of signals detected before and after the antifuse element F2 is programmed.

A solid line shows waveforms detected after the antifuse element F2 is programmed and, on the other hand, a dotted line represents those detected before the antifuse element F2 is programmed. The power stabilization signal PWRUP having a logic high state is generated by sensing the supply voltage. The first and the second control signals PWR and PWRB delay the power stabilization signal PWRUP, and output a high pulse and a low pulse by logically combining the power stabilization signal PWRUP and its delayed signal.

The dotted line of the fourth node A4 represents a leak voltage since the seventh PMOS transistor P7 and the seventh NMOS transistor N7 of the antifuse programming circuit 31 are turned off and the antifuse element F2 is in an unprogrammed state. The solid line shows a waveform when the voltage Vcc-Vt is provided to the fourth node A4 through the programmed antifuse element F2. The output Rout represents whether the antifuse element F2 is programmed or not.

As described above, unlike the conventional antifuse circuit employs the oscillator and the high voltage generator, the present invention can save the area occupied by the antifuse circuit by directly providing an external high voltage to the antifuse programming circuit through the use of the NC pin which is not used in the chip operation, and, particularly, provide a stable high voltage to the antifuse programming circuit. Further, the present invention can reduce the number of transistors which constitute the detection and latch unit detecting whether the antifuse element is programmed or not and latching the result of the detection, to thereby decrease the used area when a number of antifuse elements are employed. Thereafter, there are advantages of providing the stabilization of a high voltage and the integration of a memory device.

While the present invention has been described with respect to the particular embodiments, it will be apparent to those skilled in the art that various changes and modifications may be made without departing from the spirit and scope of the invention as defined in the following claims.

What is claimed is:

1. An antifuse circuit for use in a chip, comprising:
   a power-up detecting means for generating a power stabilization signal by detecting a supply voltage;
   a power-up pulse means for generating a first and a second control signal in response to the power stabilization signal;

an antifuse programming means for, under the control of the first and the second control signals, detecting whether an antifuse element is programmed or not, latching the result of the detection and programming the antifuse element in response to an external high voltage and a precharge signal;

a pin for receiving the external high voltage so as to program the antifuse element;

a pad for providing the external high voltage to the inside of the chip; and a diode for supplying the external high voltage to the antifuse programming means and preventing a voltage of the antifuse programming means from being provided to the pin.

2. The antifuse circuit as recited in claim 1, wherein the antifuse programming means includes:

a programming means for programming the antifuse element under the control of the external high voltage, the precharge signal and a select signal; and a detecting and latching means for detecting whether the antifuse element is programmed or not under the control of the first and the second control signals, and latching the result of the detection.

3. The antifuse circuit as recited in claim 2, wherein the programming means contains:

the antifuse element being programmed by a voltage difference between its both ends;

a diode connected between a first input node of the antifuse element and the supply voltage node, wherein the first input node is attached to a high voltage input node;

a first NMOS transistor, connected between a first node and a second input node of the antifuse element, whose gate is attached to the supply voltage node;

a second NMOS transistor, connected between the first node and ground, whose gate is attached to the select node; and a first PMOS transistor, connected between the first node and the supply voltage node, whose gate is provided with the precharge signal.

4. The antifuse circuit as recited in claim 3, wherein the detecting and latching means contains:

a second PMOS transistor for switching the supply voltage under the control of the second control signal;

a third PMOS transistor, connected between a drain of the second PMOS transistor and an output node, whose gate is attached to the first node;

a third NMOS transistor, connected between the output node and ground, whose gate is provided with the second control signal; and a fourth NMOS transistor, connected between the supply voltage node and the output node, whose gate is attached to the output node.

5. The antifuse circuit as recited in claim 4, wherein the fourth NMOS transistor, connected between the supply voltage node and the output node, stabilizes an output signal of the detecting and latching means when the output signal having a logic high state is coupled to its gate.

6. The antifuse circuit as recited in claim 1, wherein the detecting and latching means provides the gate of the second PMOS transistor with the second control signal having a low pulse and supplies the gate of the third NMOS transistor with the first control signal having a high pulse, thereby making the chip operate only during a pulse period of the first and the second control signals.

* * * * *